United States Patent [19]
Yamazaki et al.

[11] Patent Number: 5,986,286
[45] Date of Patent: *Nov. 16, 1999

[54] SEMICONDUCTOR DEVICE AND A METHOD OF MANUFACTURING THE SAME

[75] Inventors: Shunpei Yamazaki, Tokyo; Akiharu Miyanaga; Satoshi Teramoto, both of Kanagawa, all of Japan

[73] Assignee: Semiconductor Energy Laboratory Co., Ltd., Kanagawa, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/590,325

[22] Filed: Jan. 23, 1996

[30] Foreign Application Priority Data

Jan. 28, 1995 [JP] Japan .................................. 7-031562

[51] Int. Cl.$^6$ .......................... H01L 31/036; H01L 29/04
[52] U.S. Cl. ............................... 257/65; 257/66; 257/347; 257/350
[58] Field of Search ................................ 257/57, 66, 59, 257/72, 347, 350, 65

[56] References Cited

U.S. PATENT DOCUMENTS

| | | | |
|---|---|---|---|
| 5,403,772 | 4/1995 | Zhang et al. | 257/66 |
| 5,426,064 | 6/1995 | Zhang et al. | 257/66 |
| 5,481,121 | 1/1996 | Zhang et al. | 257/66 |
| 5,488,000 | 1/1996 | Zhang et al. | 257/66 |
| 5,492,843 | 2/1996 | Adachi et al. | 257/66 |
| 5,501,989 | 3/1996 | Takayama et al. | 257/66 |
| 5,508,533 | 4/1996 | Takemura | 257/66 |
| 5,514,879 | 5/1996 | Yamazaki | 257/65 |
| 5,529,937 | 6/1996 | Zhang et al. | 257/66 |
| 5,534,716 | 7/1996 | Takemura | 257/66 |
| 5,543,352 | 8/1996 | Ohtani et al. | 257/66 |
| 5,563,426 | 10/1996 | Zhang et al. | 257/66 |
| 5,569,610 | 10/1996 | Zhang et al. | 257/66 |
| 5,569,936 | 10/1996 | Zhang et al. | 257/66 |
| 5,580,792 | 12/1996 | Zhang | 257/66 |
| 5,585,291 | 12/1996 | Ohtani et al. | 257/66 |
| 5,589,694 | 12/1996 | Takayama et al. | 257/66 |
| 5,595,923 | 1/1997 | Zhang et al. | 257/713 |
| 5,595,944 | 1/1997 | Zhang et al. | 257/66 |
| 5,604,360 | 2/1997 | Zhang et al. | 257/66 |
| 5,605,846 | 2/1997 | Ohtani et al. | 257/66 |
| 5,606,179 | 2/1997 | Yamazaki et al. | 257/66 |
| 5,608,232 | 3/1997 | Yamazaki et al. | 257/66 |
| 5,614,426 | 3/1997 | Funada et al. | 257/66 |
| 5,614,733 | 3/1997 | Zhang et al. | 257/66 |
| 5,616,506 | 4/1997 | Takemura | 257/66 |
| 5,621,224 | 4/1997 | Yamazaki et al. | 257/66 |
| 5,624,851 | 4/1997 | Takayama et al. | 257/66 |
| 5,637,515 | 6/1997 | Takemura | 257/66 |
| 5,639,698 | 6/1997 | Yamazaki et al. | 257/66 |
| 5,643,826 | 7/1997 | Ohtani et al. | 257/66 |
| 5,646,424 | 7/1997 | Zhang et al. | 257/66 |
| 5,654,203 | 8/1997 | Ohtani et al. | 257/66 |
| 5,663,077 | 9/1997 | Adachi et al. | 257/66 |
| 5,700,333 | 12/1997 | Yamazaki et al. | 257/66 |
| 5,789,762 | 8/1998 | Koyama et al. | 257/66 |

FOREIGN PATENT DOCUMENTS 6-232059  8/1994  Japan ....................................... 257/57

*Primary Examiner*—Donald Monin
*Attorney, Agent, or Firm*—Sixbey, Friedman, Leedom & Ferguson, P.C.; Gerald J. Ferguson, Jr.; Jeffrey L. Costellia

[57] ABSTRACT

To provide a technology capable of promoting property of a thin film transistor formed on a glass substrate, a silicon oxide film 102 is formed on a glass substrate 101 and an amorphous silicon film 103 is formed thereon. A nickel acetate solution including nickel element that is a metal element promoting crystallization of silicon is coated and a water film 401 is formed. A state in which the nickel element is held in contact with the surface of the amorphous silicon film 103 is realized by performing spin drying. Uniform crystal growth is carried out as shown by arrow marks 104 by performing a heating treatment. An electrically inactive layer is formed by having nickel element having a high concentration which is present at front end portions of crystal growth react with an underlayer of the silicon oxide film 102. In this way the crystalline silicon film restraining the influence of nickel element can be provide.

36 Claims, 5 Drawing Sheets

SEMICONDUCTOR DEVICE AND A METHOD OF MANUFACTURING THE SAME

FIELD OF THE INVENTION

The present invention relates to a technology of forming a silicon thin film having crystalline property on a substrate having an insulating surface.

BACKGROUND OF THE INVENTION

There is known a technology of constituting a thin film transistor by using a silicon film formed on a glass substrate. The thin film transistor formed on a glass substrate is utilized in an active matrix type liquid crystal display device. A thin film transistor which has been reduced into practice currently uses an amorphous silicon film formed on a glass substrate by a plasma CVD (chemical vapor deposition) process.

However, the property of a thin film transistor obtained by an amorphous silicon film is poor and more improved property is currently required. Because of the poor property a thin film transistor of P-channel type cannot be manufactured using an amorphous silicon film ( the property is considerably low compared with that of N-channel type and is out of practical use) and accordingly, it is not actually possible to constitute a CMOS circuit. Therefore, it is not possible to realize a structure using a CMOS circuit by a thin film transistor when an amorphous silicon film is used which considerably restricts its application.

A thermal annealing at 1000° C. or more can be performed by using a single crystal wafer or a quartz substrate and therefore, it is possible to provide a crystalline silicon film having necessary properties by crystallizing the amorphous silicon film by a thermal annealing process. However, it is not possible to utilize a single crystal wafer wherein a visible light beam cannot be transmitted as a substrate constituting a liquid crystal device. Further, the quartz substrate is expensive which is inconvenient in view of production cost in expanding the area of the liquid crystal display device.

Under such a situation a technology in which an amorphous silicon film is formed on a glass substrate by a plasma CVD process or a low pressure CVD process and a crystalline silicon film is provided by some treatment, is required. As such a treatment a process by heating, a process by laser beam irradiation or the like has been known.

As a process by heating a method of crystallizing an amorphous silicon film by performing a heat treatment at a temperature of 600° C. or more for several tens hours or more has been known. However, the strain point of a Corning 7059 glass substrate which is generally used frequently as a substrate for a liquid crystal display device is 593° C. Deformation or wrinkle of the glass substrate becomes significant by exposing it under a temperature of 600° C. or more for several tens hours which considerably influences on the manufacturing of devices. For example, the mask alignment becomes difficult by the deformation of the glass substrate. Especially, the problem becomes serious in expanding area. The problem is also recognized in case where other glass substrates are utilized.

Meanwhile, there is a superiority in adopting the process by laser beam irradiation in which the amorphous silicon film can be crystallized without causing thermal damage on a glass substrate. However, the utilization of a high power laser beam over a large area is difficult in view of the technology and production cost which lowers its practical use.

There is a technology described in Japanese Unexamined Patent Publication No. 232059/1994 as a technical means solving such a problem. The publication discloses a technology in which a metal element, (for example, nickel) promoting crystallization of silicon is held in contact with the surface of an amorphous silicon film formed on a glass substrate by a plasma processing and a crystalline silicon film is provided by performing a heating treatment at approximately 550° C. for several hours.

With the heating treatment at 550° C. for several hours the deformation or wrinkle of the substrate is not so serious even if Corning 7059 glass substrate is used. Therefore, it is an extremely useful method as a technology for providing a thin film transistor by using a crystalline silicon film. This process is very useful even if a glass substrate other than Corning 7059 glass substrate is used. However, conditions of the plasma processing are delicate in the technology disclosed in Japanese Unexamined Patent Publication No. 232059/1994 and in the actual reduction to practice a metal element having an amount more than necessary is introduced in the silicon film.

For example, when the concentration of nickel element finally remaining in the silicon film is $1 \times 10^{19}$ atoms $cm^{-3}$ or more, the influence of a nickel silicide component in the silicon film becomes significant and the property as a semiconductor is deteriorated. A means of strictly controlling an amount of doping a metal element is necessary to solve the problem. However, as mentioned above it is difficult to control the concentration of a metal element doped in the silicon film by the technology disclosed in Japanese Unexamined Patent Publication No. 232059/1994.

SUMMARY OF THE INVENTION

After an intensive study of the technology solving the problem described in the above-mentioned Japanese Unexamined Patent Publication No. 232059/1994, the inventors of the present invention arrived at the following method. In the process a solution (for example, a solution of nickel acetate) including a metal element (for example, Ni) promoting crystallization of silicon is coated on the surface of an amorphous silicon film by spin coating or the like and thereafter, a heating treatment is performed by which a crystalline silicon film is obtained.

In this method it is possible to easily control the concentration of a metal element finally remaining in a silicon film by adjusting the concentration of the metal element in the solution. One example of this method is shown below.

Firstly, as shown in FIG. 2(A a Corning 7059 glass substrate or a Corning 1737 glass substrate is prepared as a substrate 101. A silicon oxide film is formed on the surface as an underlayer film 102 to a thickness of 3000 Å using a sputtering process. Next, an amorphous silicon film 103 is formed thereon to a thickness of 500 Å by a plasma CVD process or a low pressure thermal CVD process.

Further, an ultraviolet ray is irradiated thereon under an oxidizing atmosphere by which a very thin oxide film 201 is formed. The oxide film 201 is for promoting the wettability of a solution to be coated later. The thickness of the oxide film 201 seems to be approximately several tens Å (probably 50 Å or less).

Successively, as shown in FIG. 2(B) the substrate is placed on a spinner 100 and a water film 202 is formed by coating a nickel acetate solution. Thereafter, spin drying is performed and a state in which nickel atoms are held in contact with the surface of the amorphous silicon film 103 is provided. It is necessary to adjust a concentration of nickel atoms in the nickel acetate solution such that the nickel concentration in the obtained crystalline silicon film becomes $1 \times 10^{15}$ through $1 \times 10^{19}$ atoms $cm^{-3}$. The adjustment may be determined by performing experiments for establishing experimental conditions.

A heating treatment is performed under a state in which nickel element is held in contact with the surface of the amorphous silicon film 103 by which a crystalline silicon film is obtained. In the heating treatment the crystalline silicon film having the necessary crystalline property can be obtained by conditions of 550° C. and 4 hours. In this way a crystalline silicon film 106 can be provided above the glass substrate 101. (FIG. 2 (C))

A thin film transistor having improved property can be provided by manufacturing the thin film transistor using the crystalline silicon film 106. However, according to experiments by the inventors, although the obtained thin film transistor is certainly provided with improved property (operates at a speed several tens through several hundreds times as fast as those using an amorphous silicon film), it has been revealed that considerable dispersion is recognized in the property. It has also been revealed that the deterioration of the property is considerable. Moreover, the OFF current property of the manufactured thin film transistor is extremely poor.

The OFF current designates a current flowing between a source and a drain when a transistor is OFF. A thin film transistor arranged at a pixel electrode of a liquid crystal display device is for controlling electric charge inputted to and outputted from the pixel electrode and is required to have a property of holding the electric charge in the pixel electrode during a predetermined time period. However, if the OFF current is large (that is, the OFF current property is poor), the electric charge to be held in the pixel electrode gradually flows out as the OFF current and it is difficult to perform a display during a necessary time period. Under such a state the display is accompanied with flickers and becomes obscure. Therefore, it is required in the thin film transistor arranged at the pixel electrode to reduce the OFF current as less as possible.

As a result of an intensive study by the inventors with regard to the problem of the dispersion or deterioration of the property of a transistor and also the deterioration of the OFF current property, the following knowledge was provided. When the crystalline silicon film manufactured by the steps as shown FIGS. 2(A) through 2(C) is observed by a transmission electron microscope (TEM), portions are locally recognized as nickel silicide. Further, at the same time the behavior of a remaining amorphous component is observed. The nickel silicide portion becomes a trap level in a semiconductor and accordingly, the deterioration of property is naturally caused by the presence thereof. Moreover, the presence of the nickel silicide portions cannot be controlled and accordingly, causes a dispersion among respective elements. In addition thereto, the resistance of the remaining amorphous component is enhanced, which concentrates current at the nickel silicide portions having low resistance thereby accelerating the deterioration of property.

The OFF current property is also deteriorated since the movement of carriers via a trap level caused by the above-mentioned local nickel silicide becomes significant. For example, when a thin film transistor of N-channel type is OFF, the channel becomes P-type and source/channel/drain constitute a NPN junction. In case where a thin film semiconductor is constituted by a complete single crystal and the presence of the trap level can almost be disregarded, there is no current flowing between the source and the drain. However, when the trap level is present in the thin film semiconductor, the movement of carriers via the trap level cannot be disregarded thereby creating the OFF current.

The above-mentioned local presence of the nickel suicide portions is caused by the following reasons. The reason of forming the very thin oxide film 201 as shown in FIG. 2 (A) is that silicon is hydrophobic and the solution is repelled at the surface of the amorphous silicon film 103 by directly coating the solution thereon and accordingly, it is not possible to uniformly provide nickel on the surface of the amorphous silicon film 103.

By forming the oxide film 201 the wettablility is certainly improved and a state in which a solution (for example, a nickel acetate solution) is uniformly coated on the surface of the amorphous silicon film 103 is realized through optical observation.

However, by observation through photographs of an electron microscope pinholes or fine unevenness are recognized on the oxide film 201 which has been formed by the UV (ultraviolet ray) oxidation process. Especially, the thickness is observed to be nonuniform. When a solution including a metal element is coated under the state where such an oxide film is formed, microscopically, the metal element is non-continuously in contact with the amorphous silicon film 103.

Further, when a heating treatment is performed under such a state, the metal element does not diffuse uniformly from the surface of the amorphous silicon film 103 into the amorphous silicon film 103 but diffuse in the amorphous silicon film in a partially condensed form.

FIG. 3 schematically shows the behavior of progressing crystallization under such a state. According to FIG. 3, a very thin oxide film designated by numeral 200 is formed on the surface of the amorphous silicon film 103, nickel element locally concentrates on thinned portions of the oxide film 200 as shown by numeral 204. Although not shown in FIG. 3, nickel element also concentrates locally on pinhole portions formed on the oxide film.

When a heating treatment is performed under such a state nickel atoms diffuse in directions designated by numeral 205 and at the same time crystallization is progressed. In such a case nickel element concentrates on front end portions of crystal growth in the directions as designated by numeral 205 with high concentration. This phenomenon has been recognized by observing a state during crystallization by TEM photographs (transmission electron microscope).

Accordingly, with the progress of crystallization nickel concentrates on portions 206 where the front end portions of crystal growth collide with each other. FIG. 3 shows a state in which nickel element is concentrated at constant intervals. Actually, nickel element concentrates on unspecified locations. Therefore, a number of portions where nickel element concentrates as shown by numeral 206 are formed at unspecified locations.

It is an object of the present invention to provide a technology by which a metal element dose not concentrate locally in a silicon film in manufacturing a crystalline silicon film by using a metal element promoting crystallization of silicon.

It is another object of the present invention to provide a crystalline silicon film and its manufacturing technology whereby no dispersion or deterioration of properties is caused and the OFF current property is improved in constituting a thin film transistor.

It is still another object of the present invention to provide a thin film transistor with no dispersion or deterioration of properties and with improved OFF current property.

The present invention provides a semiconductor wherein a crystalline silicon film is formed on a silicon oxide film, a metal element promoting crystallization of silicon is included in the crystalline silicon film by a concentration of $1 \times 10^{15}$ atoms cm$^{-3}$ through $1 \times 10^{19}$ atoms cm$^{-3}$ and a silicon oxide layer containing the metal element (metal-silicon oxide layer) is formed at an interface between the silicon oxide film and the crystalline silicon film and the vicinity thereof.

In the above-mentioned constitution one or a plurality of elements selected from the group of Fe, Co, Ni, Ru, Rh, Pd, Os, Ir, Pt, Cu and Au can be used as the metal element. Especially, high reproducibility and effect can be provided by using nickel (Ni).

Under the above-mentioned constitution, the average thickness of the metal-silicon oxide layer is 10 through 200 Å. The metal-silicon oxide layer is a layer fixing or freezing the metal element used in the crystallization of silicon by oxidizing it and its major component is designated by $SiM_xO_y$ (0<x<1, 0<y<2, M designates the metal element). Or, this layer may be designated as a mixed layer whose major component is the metal element, silicon and oxygen.

In any way this layer is an insulated layer or a layer of which resistance is sufficiently high, or the layer may be indicated as an electrically inactivated layer. Further, this layer may not be uniform.

The concentration of the metal element in this layer is larger than the concentration of the metal element in the crystalline silicon film having a property as a semiconductor. The crystalline silicon film having the property as a semiconductor constitutes, for example, an activated layer of a thin film transistor and accordingly, the concentration of the metal element in the film needs to be $1 \times 10^{15}$ atoms cm$^{-3}$ to $1 \times 10^{19}$ atoms cm$^{-3}$ The reason is that the operation of crystallization is not provided below this concentration range and the property as a semiconductor is lost above the concentration range. However, the metal-silicon oxide layer is the electrically inactivated layer and accordingly, the concentration of the metal element in this layer may be enhanced. The enhancement is naturally applicable in the allowable range and under the condition of electrical inactiveness. Incidently, the concentration in this specification is defined as a maximum value provided by SIMS (secondary ion mass spectrometry).

Another feature of the present invention provides a method of making a semiconductor comprising the steps of forming an amorphous silicon film on a silicon oxide film, coating a solution including a metal element promoting crystallization of silicon on the silicon oxide film, diffusing the metal element in the above-mentioned amorphous silicon film by performing a heating treatment and forming a silicon oxide layer containing the metal element which is oxidized by irradiating a laser beam or a strong beam at an interface between the silicon oxide film and the silicon film and the vicinity thereof, wherein the solution includes a surfactant.

Under the above-mentioned structure it is effective to separate hydrogen in the amorphous silicon film by performing a heating treatment at a temperature of 300° C. through 500° C. before coating the solution including the metal element.

It is preferable to render the hydrogen concentration of the amorphous silicon film as 0.01 through 5 atomic % by this step. Also, the crystalline silicon film contains a recombination center neutralizer selected from the group consisting of hydrogen or a halogen at 0.005 to 5 atom %.

Under the above-mentioned constitution it is preferable to perform a heating treatment at a temperature of 450° C. or more and the strain point of a glass substrate or less when the glass substrate is used as a substrate. The reason is that the lower limit of the temperature for crystallization by the heating treatment is approximately 450° C. and it is necessary to perform the heating treatment at a temperature of the strain point or less to prevent deformation of the glass substrate. Generally speaking, the metal element diffuses by this heating treatment and the amorphous silicon film is crystallized. However, when the heating temperature is low (approximately 500° C. or less) and the heating time period is short, the diffusion of the metal element is performed without crystallization. In such a case it is necessary to perform the crystallization of the amorphous silicon film by heating it in a separate step or irradiating a laser beam or a strong beam.

Shown below are kinds of solutions used for introducing various metal elements.

When Fe (iron) is used as a catalyst element there are materials known as iron salts as its compounds such as ferrous bromide (FeBr$_2$ 6H$_2$O), ferric bromide (FeBr$_3$ 6H$_2$O), ferric acetate (Fe(C2H3O2)$_3$xH$_2$O), ferrous chloride (FeCl$_2$ 4H$_2$O), ferric chloride (FeCl3 6H$_2$O), ferric fluoride (FeF$_3$ 3H$_2$O), ferric nitrate (Fe(NO$_3$)$_3$ 9H$_2$O), ferrous phosphate (Fe$_3$(PO$_4$)$_2$ 8H$_2$O) and ferric phosphate (FePO$_4$ 2H$_2$O).

When Co (cobalt) is used as a catalyst element, there are materials known as cobalt salts as its compounds such as cobalt bromide (CoBr6H$_2$O), cobalt acetate (Co(C$_2$H$_3$O$_2$)$_2$ 4H$_2$O), cobalt chloride (CoCl$_2$ 6H$_2$O), cobalt fluoride (CoF$_2$ xH$_2$O) and cobalt nitrate (Co(NO$_3$)$_2$ 6H$_2$O).

When Ru (ruthenium) is used as a catalyst element, there are materials known as ruthenium salts as its compounds such as ruthenium chloride (RuCl$_3$H$_2$O).

When Rh (rhodium) is used as a catalyst element, there are materials known as rhodium salts as its compounds such as rhodium chloride (RhCl$_3$ 3H$_2$O).

When Pd (palladium) is used as a catalyst element, there are materials known as palladium salts as its compounds such as palladium chloride (PdCl$_2$ 2H$_2$O).

When Os (osmium) is used as a catalyst element, there are materials known as osmium salts as its compounds such as osmium chloride (OsCl$_3$).

When Ir (iridium) is used as a catalyst element, there are materials known as iridium salts as its compounds such as iridium trichloride (IrCl$_3$ 3H$_2$O) and iridium tetrachloride (Ir Cl$_4$).

When Pt (platinum) is used as a catalyst element, there are materials known as platinum salts as its compounds such as platinum tetrachloride (PtCl$_4$ 5H$_2$O).

When Cu (copper) is used as a catalyst element, there are materials as its compounds such as cupric acetate (Cu (CH$_3$COO)$_2$), cupric chloride (CuCl$_2$ 2H$_2$O) and cupric nitrate (Cu(NO$_3$)$_2$3H$_2$O).

When gold is used as a catalyst element, there are materials as its compounds such as auric chloride (AuCl$_3$xH$_2$O) and a gold chloride (AuHCl$_4$ 4H$_2$O).

The following Table 1 through Table 3 show surfactants which can be used in the present invention.

TABLE 1

C$_7$F$_{15}$COOCN$_4$
Perfluoroalkylsulfonic acid ammonium A
Perfluoroalkylsulfonic acid ammonium B
Perfluoroalkyl betaine
RfCH$_2$CH$_2$O(CH$_2$CH$_2$O)$_x$H C$_9$F$_{17}$SO$_2$N(C$_2$H$_4$O)$_n$H
  |
  R Perfluoroalkyl trimethyle ammonium salt
Perfluoroalkyl carboxylic acid
C$_8$F$_{17}$COOH
Perfluoroalkyl polyoxyethylene ethanol
Fluorinated alkyl ester
Perfluoroalkyl EO additive A
Perfluoroalkyl EO additive B
Perfluoroalkyl carboxylic acid ammonium A
Perfluoroalkyl carboxylic acid ammonium B
Perfluoroalkyl carboxylic acid ammonium C

C$_9$F$_{17}$NC$_3$H$_7$
  |
  CH$_2$COONH$_4$

RfCH$_2$CH$_2$SCH$_2$CH$_2$N(CH$_3$)$_3$
                         |
                         CH$_3$SO$_4$
RfN + H$_4$I$^-$
RfCH$_2$CH$_2$SCH$_2$CH$_2$CO$_2$NH$_4$

TABLE 2

Alkyl diphenyletherdisulfonic acid salt
Octadecylamine acetate
Coconut amine acetate
Dialkyl sulfosuccinic acid ammonium
Dimethylalkyl(coconut) betaine
Stearylamine acetate
Soft alkylbenzenesulfonic acid ammonium
Dodecylbenzensulfonic acid ammonium
Dodecyltrimethyl ammonium chloride
Tri-n-octylamine
Polyethylene glycol monostearate
Polyoxyethylene alkyl ether
Polyoxyethylene alkylphenyl ether
Polyoxyethylene alkylphenyl ether sulfate ammonium
Polyoxyethylene oleic acid ester
Polyoxyethylene higher alcohol
Polyoxyethylene nonylphenyl ether
Polyoxyethylene lanolin alcohol ether
Polyoxyethylene lanolinic acid ester
Polyoxyethyle lanolin fatty acid ester
Polycarboxylic acid ammonium
Monoglycerine ester
Lauryl triethanol sulfate amine
Lanolin alcohol

TABLE 3

C$_3$H$_7$COOH
C$_4$H$_9$COOH
C$_5$H$_{11}$NH$_2$
C$_6$H$_{13}$NH$_2$
C$_7$H$_{15}$COOH
C$_8$H$_{17}$COOH
C$_8$H$_{17}$NH$_2$
C$_8$H$_{17}$OH
C$_9$H$_{17}$NH$_2$
C$_9$H$_{17}$COOH
C$_{10}$H$_{21}$NH$_2$
C$_{10}$H$_{21}$OH

TABLE 3-continued

C$_{10}$H$_{21}$COOH
C$_{12}$H$_{25}$NH$_2$
C$_{13}$H$_{27}$COOH
C$_{14}$H$_{29}$NH$_2$
C$_{14}$H$_{29}$NH$_4$
C$_{14}$H$_{27}$NH$_2$
C$_{14}$H$_{29}$COOH
C$_{18}$H$_{37}$NH$_2$
C$_{18}$H$_{37}$OH
C$_{18}$H$_{37}$NH$_2$
C$_{20}$H$_{41}$NH$_4$
(C$_{10}$H$_{21}$)$_2$NH
RCOO(CH$_2$CH$_2$O)$_n$H
C$_{11}$H$_{23}$CO(CH$_2$CH$_2$)$_n$H

The present invention provides as another feature a method of making a semiconductor comprising the steps of forming an amorphous silicon film on a silicon oxide film, holding a metal element promoting crystallization of silicon substantially in contact with a surface of the amorphous silicon film, having crystals grow from an upper face toward a lower face of the amorphous silicon film by performing a heating treatment and forming a silicide layer of the metal element at an interface between the silicon oxide film and the amorphous silicon film and the vicinity thereof and oxidizing the silicide layer by having the silicide layer of the metal element react with the silicon oxide film by irradiating a laser beam or a strong beam.

A specific example of the above-mentioned constitution is shown in FIGS. 1(A),1(B),1(C) and 1(D). In the steps shown by these figures, a layer 109 including nickel element is formed on an amorphous silicon film 103 and nickel element diffuses from the layer 109 in a heating step (diffusion is uniformly performed toward the downward direction as shown by arrow marks 104) and uniform crystal growth is performed as shown by the arrow marks 104 simultaneously with the diffusion.

In the step shown in FIG. 1(D) fixing (freezing) of nickel element is performed and a silicon oxide layer 105 containing nickel element (the metal element) is formed.

Preferably, the thickness of the silicon film should be 500 Å or smaller so that the metal element is effectively freezed by the underlying silicon oxide film. However, in view of the uniformity of the deposition of the silicon film, the thickness should be not lower than 100 Å. Also, it has been found that the energy density of the laser light should be from 250 mJ/cm$^2$ to 400 mJ/cm$^2$.

The present invention provides as another feature a semiconductor device which is a thin film transistor having an activated layer composed of a crystalline silicon film formed on a silicon oxide film, wherein a metal element promoting crystallization of silicon is included in the activated layer by a concentration of 1×10$^{15}$ atoms cm$^{-3}$ through 1×10$^{19}$ atoms cm$^{-3}$ and a metal-silicon oxide layer is formed at an interface between the silicon oxide film and the activated layer and the vicinity thereof.

The present invention provides as another feature a semiconductor device comprising a crystalline silicon film including a metal element promoting crystallization of silicon and an electrically inactivated layer including the metal element which is in contact with the crystalline silicon film.

The present invention provides as another feature a semiconductor device comprising a crystalline silicon film including a metal element promoting crystallization of silicon and electrically inactivated layer including the metal element which is in the crystalline silicon film.

The above-mentioned two constitutions present a difference in views. The difference is caused by whether the electrically inactivated layer, that is, the metal-silicon oxide layer is recognized as separated from the crystalline silicon film which functions as a semiconductor or whether the electrically inactivated layer is recognized as present at a portion of the crystalline silicon film. That is, whether these layers are separately recognized since their electrical properties are different, or whether one of them constitutes a portion of the other since they belong to the same silicon film.

The present invention provides as another feature a semiconductor device comprising a crystalline silicon film including a metal element promoting crystallization of silicon and an electrically inactivated layer including the metal element which is in contact with the crystalline silicon film, wherein no components essentially showing a metallic property is not present in the layers including the metal element.

The above constitution may be regarded as a film at least constituted by a first layer wherein crystals grow isotropically (or uniformly from one side to other directions) and an electrically freezed (electrically inactivated) second layer. When an activated layer of a thin film transistor is constituted by using the film, the first layer can be rendered as source/drain regions or a channel forming region. The second layer is electrically inactive ( its resistance is enhanced in an allowable range) and accordingly, it does not especially influence on the operation of the device.

In the above-mentioned constitution although the first layer functions as the crystalline silicon film showing a semiconductor property, no components showing essentially a property as a metal (electrical property) are included in the first film. Such a property is provided by freezing the metal element which becomes unnecessary as a result of the crystal growth (diffused and finally segregated without forming crystal nuclei) as the second layer.

The above-mentioned film constituted at least by the first layer and the second layer may be defined as isotropically grown freeze film (TST).

In the method of coating the metal element promoting crystallization of silicon on the surface of the amorphous silicon film by using a solution, it is possible to firstly remove the oxide film on the surface of the amorphous silicon film and thereafter to hold the metal element in a dispersed state on the surface of the amorphous silicon film by the operation of a surfactant. This step is shown in FIG. 4. In this case the oxide film is not formed on the surface of the amorphous silicon film 103 and accordingly, the surface of the amorphous silicon film 103 is uniformly exposed. Further, the metal element can uniformly be dispersed and held in contact with the surface of the amorphous silicon film as shown by numeral 402 in FIG. 4 by the operation of a surfactant.

When a heating treatment is performed under this state, the metal element is uniformly dispersed in the amorphous silicon film as shown by arrow marks 403 promoting its crystallization.

When the diffusion of the metal element into the silicon film is made uniform in the heating treatment step, the crystal growth accompanied by diffusion of the metal element as shown by the arrow marks 104 in FIG. 1(B) or the arrow marks 403 in FIG. 4, can also be made uniform. As a result of the crystal growth, uniform crystal growth is progressed and the crystalline silicon film 106 (FIG. 1(C)) with no remaining amorphous component can be provided. In the crystalline silicon film the metal element is present at high concentration at a lower face portion of the silicon film 106 that is a front end region where the crystal growth has progressed and an upper face portion of the silicon film 106 that is a region where the metal element is held firstly in contact therewith.

That is, the metal element is present at high concentration at the layered portions shown by numerals 105 and 109 in FIG. 1(C). Especially in the layer shown by numeral 105 the metal is in the form of a metal silicide.

When a laser beam is irradiated under this state, the layer 105 of the metal silicide is made react with the underlayer of the silicon oxide film 102 and the layer can be rendered an insulating layer designated by $SiNi_xO_y$.

The layer shown by numeral 109 is removed by etching as necessary. In the crystalline silicon film 106 provided as above, the metal element considerably influencing on the electric property and stability is fixed as the insulated (or having high resistance) metal silicon oxide layer. Therefore, the density of the trap level caused by the presence of the metal component in the film is small and the crystalline silicon film having improved electric property can be provided. At the same time, the crystalline silicon film with little deterioration can be provided.

The OFF current can be reduced in a thin film transistor constituted by using such a crystalline silicon film since the density of the trap level in the activated layer can be reduced. Further, the amorphous component can be restrained from remaining and accordingly, the concentration of current flowing in the silicon film can be prevented and the deterioration of property can be restrained.

DETAILED DESCRIPTION OF REFERRED EMBODIMENTS

[Embodiment 1]

Figure 4:
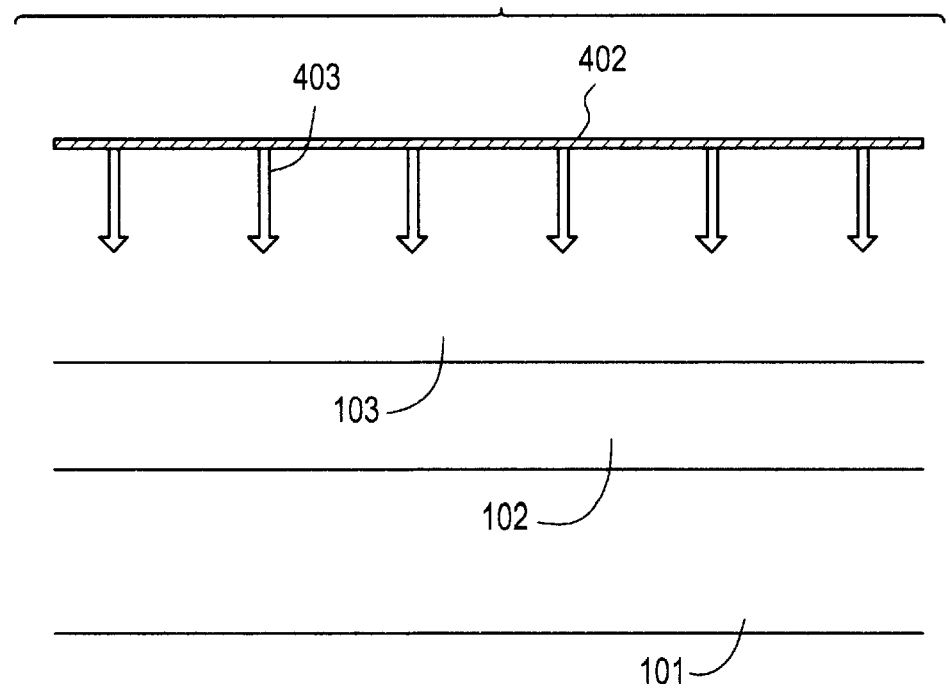
FIG. 4 is a view showing progress of crystallization.

Shown here is a basic method of manufacturing a crystalline silicon film by using the present invention. An explanation will be given of respective steps of the embodiment by using FIG. 4. Firstly, a Corning 7059 glass substrate or a Corning 1737 glass substrate is prepared as a glass substrate 101. A silicon oxide film as an underlayer film 102 is formed on the glass substrate 101 to a thickness of 3000 Å by a sputtering process or a plasma CVD process using TEOS gas. The underlayer of the silicon oxide film 102 may be formed by using a thermal CVD process. The silicon oxide film functions for insulating a metal component that is present by being concentrated on a lower face of a silicon film in a later step. Further, it also functions as a barrier layer for preventing impurities from diffusing from the glass substrate 101. Further, it also functions to alleviate stresses operating between the glass substrate 101 and the silicon film.

Figure 1A:
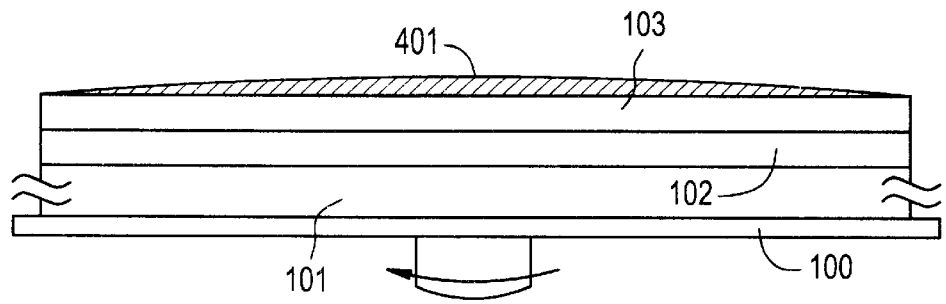
FIGS. 1(A), 1(B), 1(C) and 1(D) indicate states of crystallization.

Next, an amorphous silicon film 103 is formed by a necessary thickness by a plasma CVD process or a low pressure thermal CVD process. In this example it is formed to a thickness of 500 Å. In this way a state shown in FIG. 1(A) is provided. In this state the surface of the amorphous silicon film 103 is exposed and accordingly, a natural oxide film is formed on the surface.

The natural oxide film is a very thin oxide film of approximately several tens Å and is not uniform as compared with its thickness.

Next, hydrogen in the film is discharged from the silicon film by performing a heating treatment at a temperature lower than the temperature where crystallization of the amorphous silicon film becomes significant, to accelerate uniform crystallization in a later step. The temperature may be approximately 500° C. or less, preferably, 300° C. through 500° C. and more preferably 450° C. through 500° C. and the heating time period is approximately 1 hour. By the heating treatment hydrogen in the film is separated and unpaired bondings of silicon are present in a large amount. In such a state the threshold energy for crystallization is lowered and uniform crystal state is easy to progress. Further, the heating treatment step is preferably performed in an inert atmosphere.

Next, the natural oxide film formed on the surface of the amorphous silicon film is removed by buffer hydrofluoric acid.

Here, a nickel acetate solution added with a surfactant is prepared. In this solution a surfactant of 1 weight percent is added to the nickel acetate solution containing nickel element by 10 ppm by weight.

The sample shown in FIG. 1(A) is placed on a spinner 100 and the above-mentioned solution is coated thereon. A water film 401 of the solution is formed in this state. Extra solution is removed by rotating the spinner. At this occasion nickel element is uniformly dispersed on the surface of the amorphous silicon film of which oxide film has been removed, by the operation of the surfactant. Thereby, a state where nickel element is uniformly dispersed and in contact with the surface of the amorphous silicon film 103 is provided.

Figure 1B:
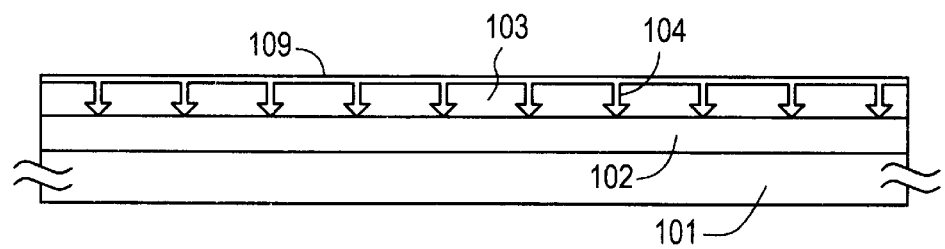
Figure 1C:
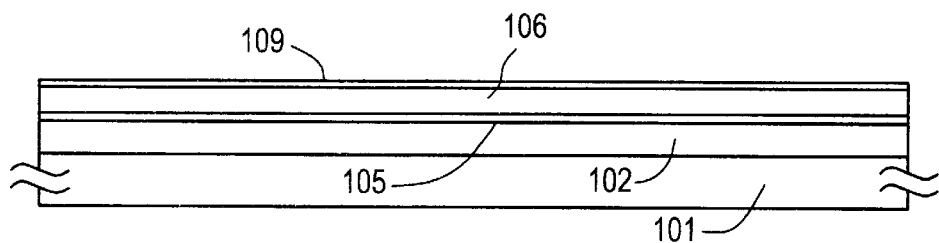

Thereafter, the amorphous silicon film 103 is crystallized by performing a heating treatment at 550° C. for 4 hours. In this case crystallization uniformly progresses from the upper face toward the lower face as shown by the arrow marks 104 in FIG. 1(B). In this way the crystalline silicon film 106 where nickel element is uniformly dispersed can be provided. In the crystalline silicon film 106 nickel element does not concentrate locally in the film and silicon is uniformly crystallized. Further, almost no amorphous component remains.

In the crystal growth, the front end portions of the growth are aligned and accordingly, a region having high nickel concentration finally becomes in a layered form and present in the vicinity of the interface between the crystalline silicon film 106 and the silicon oxide film 102. The thickness of the layered region 105 is approximately 10 through 200 Å and the region is composed of nickel silicide.

In these steps it is important to prevent the silicon film from being in contact with air or an oxidizing atmosphere during the heating treatment step for separating hydrogen and the heating treatment step for crystallization. Specifically, it is preferable to continuously progress the operation under an inert atmosphere.

Figure 1D:
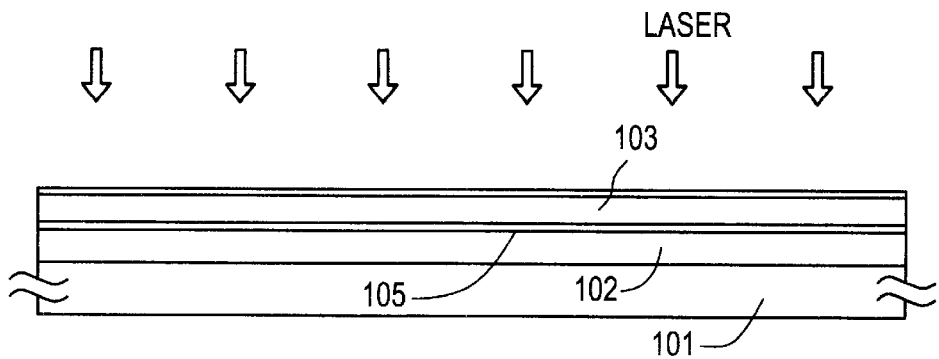
Figure 2A:
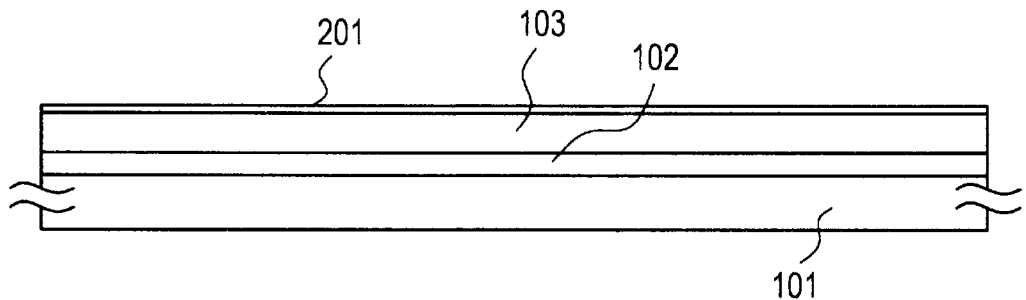
FIGS. 2(A), 2(B) and 2(C) indicate steps of crystallizing an amorphous silicon film by using a nickel acetate solution.
Figure 2B:
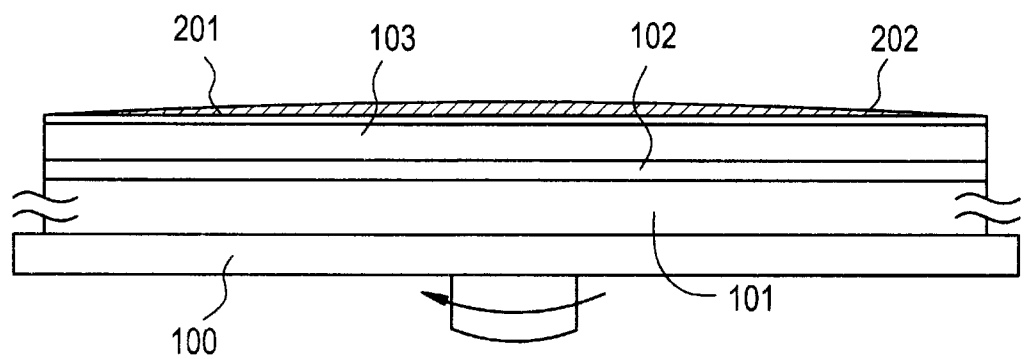
Figure 2C:
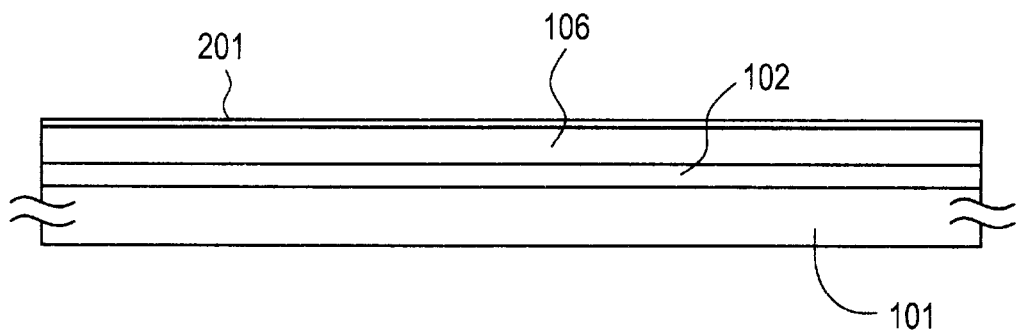
Figure 3:
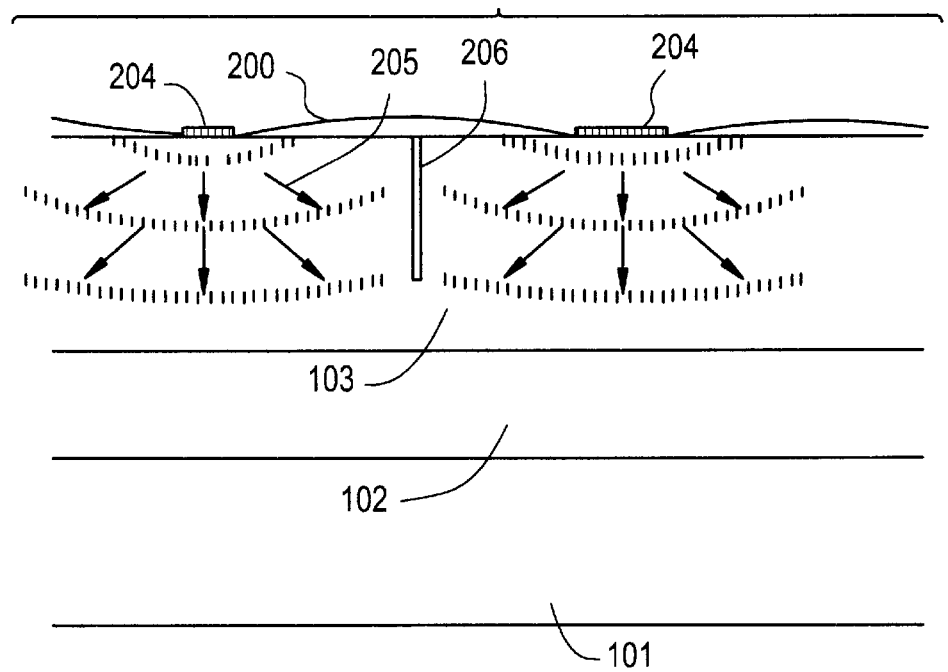
FIG. 3 is a view showing progress of crystallization.

Next, a KrF excimer laser beam is irradiated at an energy density of 300 mJ/cm$^2$ as shown in FIG. 1(D). Then, the layered region 105 comprising nickel silicide react with the underlayer of the silicon oxide film 102 and nickel silicide is oxidized. That is, a reaction is caused among silicon, nickel and oxygen by which $SiNi_xO_y$ is formed in a layered shape. As a result, the layered region 105 showing a property as a metal is insulated. Or, the resistance thereof is enhanced to a value practically regarded as that of an insulator.

Further, the layer 109 on the surface of the crystalline silicon film is removed by wet etching using buffer hydrofluoric acid. A layer of nickel silicide is formed in the layer 109 since it is a portion where nickel element is held in contact therewith in the first stage. Therefore, a crystalline silicon film which excludes the influence of nickel silicide as less as possible can be provided by removing this layer.

[Embodiment 2]

Figure 5A:
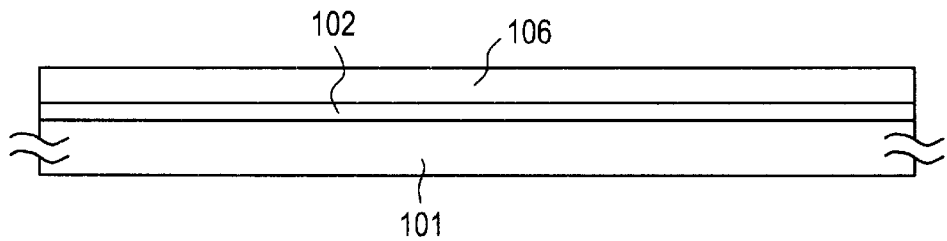
FIGS. 5(A), 5(B), 5(C) and 5(D) are views showing steps of manufacturing a thin film transistor in an embodiment.
Figure 5B:
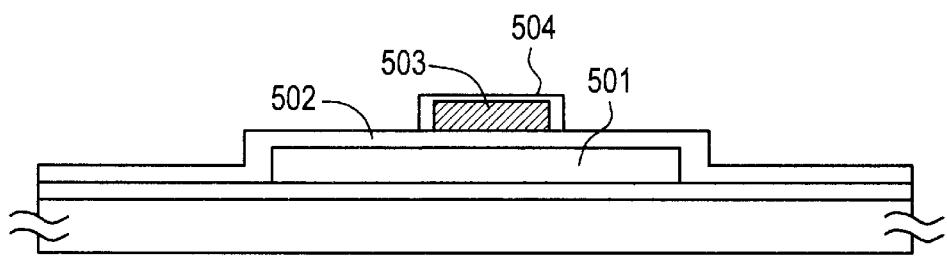

This embodiment shows an example of making a thin film transistor of N-channel type by using a crystalline silicon film obtained by the method shown in Embodiment 1. FIGS. 5(A), 5(B), 5(C) and 5(D) show steps of making a thin film transistor in this embodiment. Firstly, as shown in FIG. 5(A) a crystalline silicon film 106 is formed on a glass substrate 101 by the method in Embodiment 1. Numeral 102 designates a silicon oxide film having a thickness of 3000 Å functioning as an underlayer film.

When the state as shown in FIG. 5(A) is provided, the crystalline silicon film 106 is patterned by which an activated layer 501 of a thin film transistor is provided. Next, a gate insulating film 502 is formed to a thickness of 1000 Å by sputtering. Further, a film whose major component is aluminum is formed to a thickness of 6000 Å by an electron beam evaporation and a gate electrode 503 is formed by patterning it. When the gate electrode 503 has been formed, anodic oxidation is performed in an electrolysis solution with the gate electrode as an anode by which an oxide layer 504 is formed. The oxide layer is made grow to a thickness of approximately 2000 Å. In this way a state as shown in FIG. 5 (B) is provided.

Next, P(phosphorous) ions are accelerated and implanted by ion implantation or plasma doping. In this step implantation of P ions is performed with the gate electrode 503 and the surrounding oxide layer 504 as a mask. Thereby, a source region 505, an offset gate region 506, a channel forming region 507 and a source region 508 are formed in a self-alignment manner. (FIG. 5(C)).

Figure 5C:
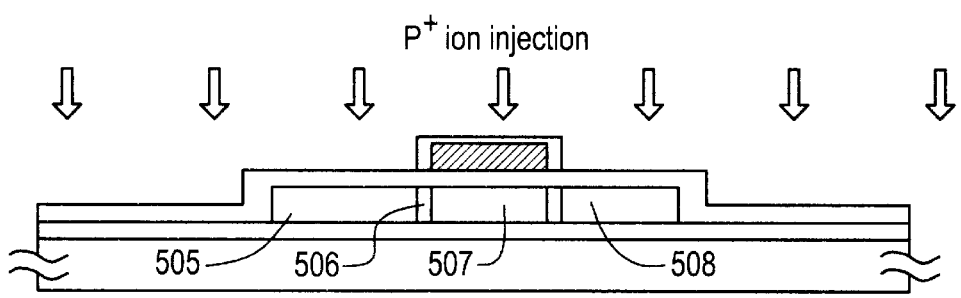
Figure 5D:
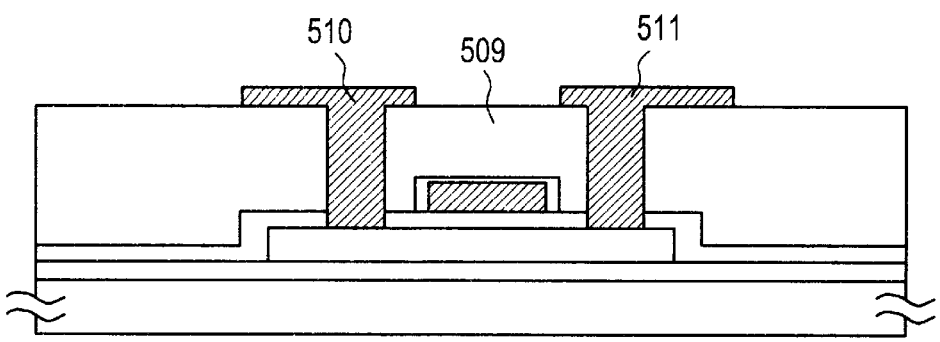
Figure 6A:
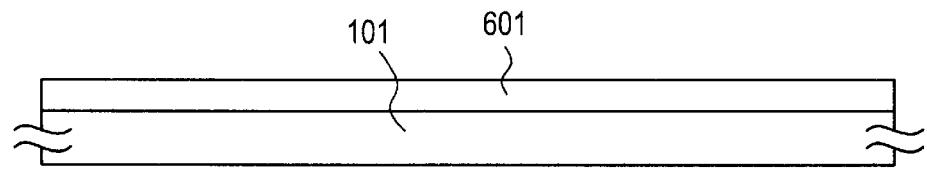
FIGS. 6(A), 6(B), 6(C) and 6(D) are views showing steps of crystallizing an amorphous silicon film by using a nickel acetate solution.
Figure 6B:
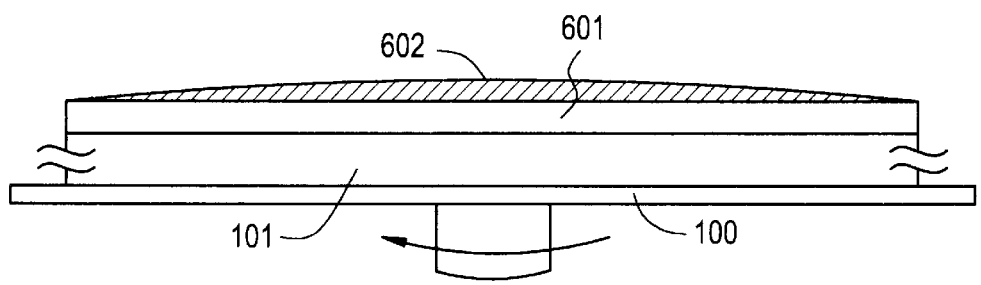
Figure 6C:
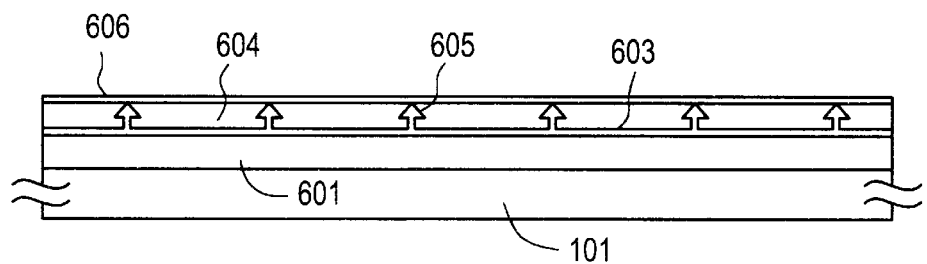
Figure 6D:
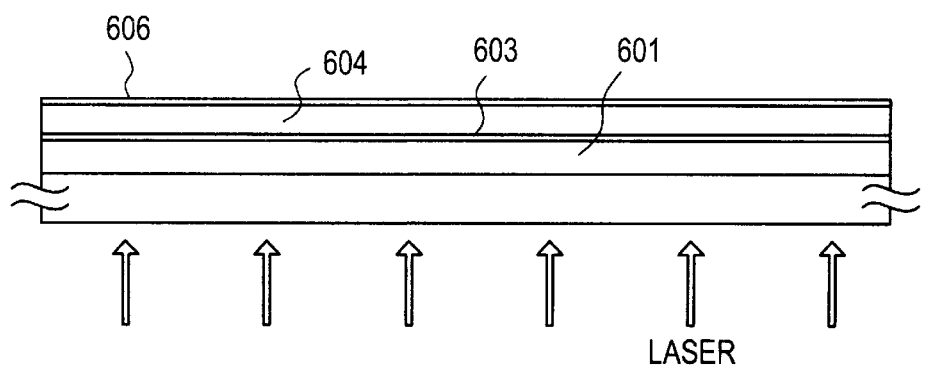

After a state as shown in FIG. 5(C) is provided, a silicon oxide film is formed to a thickness of 6000 Å by a plasma CVD method as an interlayer insulating film 509. After forming contact holes a source electrode 510 and a drain electrode 511 which are laminated bodies of titanium and aluminum are formed. Finally, a thin film transistor shown in FIG. 5(D) is completed by performing a heating treatment at 350° C. in a hydrogen atmosphere.

[Embodiment 3]

This embodiment concerns a constitution of a thin film transistor in which $V_{th}$ (threshold voltage) is controlled by doping B(boron) ions in a channel forming region in a thin film transistor of N-channel type. In controlling $V_{th}$ of a thin film transistor of N-channel type B ions are accelerated and implanted onto the channel forming region to constitute a concentration of $1 \times 10^{15}$ through $1 \times 10^{18}$ atoms cm$^{-3}$ by plasma doping or ion implantation.

[Embodiment 4]

This embodiment concerns a constitution in which crystallization is performed by holding a metal element promoting crystallization of silicon in contact with a lower face of an amorphous silicon film. FIGS. 6(A), 6(B), 6(C) and 6(D) indicate manufacturing steps of the embodiment. Firstly, a silicon oxide film 601 is formed on a Corning 7059 or 1737 glass substrate 101 to a thickness of approximately 3000 Å by a plasma CVD process or a low pressure thermal CVD process. The formation of the silicon oxide film 601 must be performed by a method excellent in flatness (FIG. 6(A)).

Next, the substrate is placed on a spinner 100 and a nickel acetate solution as explained in Embodiment 1 including a surfactant is coated thereon by which a water film 602 is formed. (FIG. 6(B)).

Further, a state in which nickel element is held in contact with the surface of the silicon oxide film 601 is realized by performing spin drying. Under this state a layer of nickel element is formed on the surface of the silicon oxide film 601. A heating treatment at a temperature of approximately 200 through 400° C. may be performed also in this step.

Next, an amorphous silicon film 604 is formed by a low pressure thermal CVD process. The low pressure thermal CVD process is used here to prevent nickel element on the surface of the silicon oxide film 601 from scattering in a chamber by the energy of plasma. Crystallization is performed by performing a heating treatment at 550° C. by 4 hours.

In this step diffusion of nickel element from the nickel layer 603 formed on the surface of the silicon oxide film 601 as shown by arrow marks 605 and at the same time crystal growth is performed as shown by the arrow marks 605. As a result of crystal growth nickel element concentrates on front end portions of the crystal growth and accordingly, a nickel silicide layer 606 is finally formed on the surface of the crystalline silicon film 604 which has finally been crystallized and/or the vicinity of the surface. (FIG. 6(D))

Next, XeF excimer laser (351, 353 nm) is irradiated from the side of the substrate. XeF excimer laser is used to make a laser beam transmit through the glass substrate 101. In this step the nickel layer 603 react with the silicon oxide film 601 and further, with the crystalline silicon film 604 into an oxidized nickel silicide layer.

Next, the surface of the crystalline silicon film 604 is etched by buffer hydrofluoric acid by which the nickel silicide layer 606 is removed. Under this state the nickel layer designated by numeral 603 is insulated or the resistance thereof is increased and accordingly, it does not influence on the electric property of the crystalline silicon film 604. Therefore, the crystalline silicon film 604 can be provided with high quality.

By using the technology disclosed in the present invention the problem in which a metal element is locally concentrated in a silicon film can be solved in making a crystalline silicon film using the metal element promoting crystallization of silicon.

Further, a crystalline silicon film having improved OFF current property and causing no dispersion or deterioration of property in constituting a thin film transistor can be provided.

Further, a thin film transistor having improved OFF current property and causing no dispersion or deterioration of property can be provided.

What is claimed is:

1. A semiconductor device comprising a semiconductor film comprising crystal silicon formed over an insulating film comprising silicon oxide and a channel region formed in said semiconductor film, wherein said semiconductor film contains a metal element capable of promoting crystallization thereof at a concentration not exceeding $5 \times 10^{19}$ atoms/cm$^3$ and a metal-silicon oxide layer in which said metal element is fixed is formed at or in the vicinity of an interface between said insulating film and said channel region.

2. The semiconductor device of claim 1, wherein said metal element is one or a plurality of elements selected from the group consisting of Fe, Co, Ni, Ru, Rh, Pd, Os, Ir, Pt, Cu, and Au.

3. The semiconductor device of claim 1, wherein an average thickness of said metal-silicon oxide layer is 10 through 200 Å and a chemical formula thereof is designated by $Si_tM_xO_y$ (0<x<1, 0<y<2, M designates the metal element).

4. A semiconductor device comprising:

an active layer comprising a crystal silicon film formed on a silicon oxide film, said active layer containing a metal element capable of promoting a crystallization of silicon at $1 \times 10^{15}$ to $1 \times 10^{19}$ atoms/cm$^3$, wherein a silicon oxide layer containing said metal element is formed between said silicon oxide film and said active layer.

5. The semiconductor device of claim 4 wherein said metal element is one or a plurality of elements selected from the group consisting of Fe, Co, Ni, Ru, Rh, Pd, Os, Ir, Pt, Cu, and Au.

6. The semiconductor device of claim 4 wherein said silicon oxide layer containing the metal element is 10–200 Å thick.

7. The semiconductor device of claim 4 wherein said active layer contains said metal element at a lower concentration than in said silicon oxide layer containing said metal element.

8. A semiconductor device comprising:

a silicon oxide film;

a silicon oxide layer containing a metal element formed on the silicon oxide film; and a crystalline silicon film formed on said silicon oxide layer;

wherein the metal element is substantially dispersed in the crystalline silicon film.

9. The semiconductor device of claim 8 wherein said metal element is one or a plurality of elements selected from the group consisting of Fe, Co, Ni, Ru, Rh, Pd, Os, Ir, Pt, Cu and Au.

10. The semiconductor device of claim 8 wherein the silicon oxide layer containing the metal element is 10–200 Å thick.

11. The semiconductor device of claim 8 wherein said active layer contains said metal element at a lower concentration than in said silicon oxide layer containing said metal element.

12. A semiconductor device comprising:

a channel forming region comprising crystalline silicon containing a metal element, said metal element capable of promoting a crystallization of silicon; and a layer in contact with said channel forming region, wherein said metal element is electrically inactivated in said layer.

13. A semiconductor device comprising:

a crystalline silicon film containing a metal element, said metal element capable of promoting a crystallization of silicon; and an electrically inactivated layer containing said metal element formed within said crystalline silicon film.

14. The semiconductor device of claim 12 or 13 wherein said electrically inactivated layer is represented by a stoichiometric formula $SiM_xO_y$ (0<x<1, 0<y<2, M designates the metal element).

15. The semiconductor device of claim 12 or 13 wherein said metal element is one or a plurality of elements selected from the group consisting of Fe, Co, Ni, Ru, Rh, Pd, Os, Ir, Pt, Cu and Au.

16. The semiconductor device of claim 12 or 13 wherein said crystalline silicon film contains said metal element at a lower concentration than said electrically inactivated layer.

17. The semiconductor device of claim 12 or 13 wherein said crystalline silicon film is an active layer of a thin film transistor.

18. The semiconductor device of claim 12 or 13 wherein said crystalline silicon film contains a recombination center neutralizer selected from the group consisting of hydrogen or a halogen at 0.005 to 5 atom %.

19. The semiconductor device of claim 12 or 13 wherein said crystalline silicon film contains said metal element in a concentration of $1\times10^{15}$ to $5\times10^{19}$ atoms/cm$^3$.

20. A semiconductor device comprising:

A crystalline silicon film including a metal element promoting crystallization of silicon; and an electrically inactivated layer including the metal element and being in contact with the crystalline silicon film;

wherein a component having essentially a metallic property is not present in the layers including the metal element.

21. The semiconductor device according to claim 20, wherein a chemical formula of the electrically inactivated layer including the metal element is designated by SiM$_x$O$_y$ (0<x<1, 0<y<2, M designates the metal element).

22. The semiconductor device according to claim 20, wherein one or a plurality of elements selected from the group consisting of Fe, Co, Ni, Ru, Rh, Pd, Os, Ir, Pt, Cu and Au is used as the metal element.

23. A semiconductor device comprising:

an underlying layer comprising silicon oxide;

a semiconductor film comprising crystal silicon formed over said underlying layer, said semiconductor film having been crystallized by virtue of a catalyst metal;

a channel region formed in said semiconductor film;

an insulating layer formed at a boundary between said underlying layer and said semiconductor film, said insulating layer comprising an oxide of silicon and said catalyst metal.

24. A semiconductor device according to claim 23 wherein said semiconductor film contains said catalyst metal in a concentration not exceeding $1\times10^{19}$ atoms/cm$^3$.

25. A semiconductor device according to claim 23 further comprising a gate electrode over said semiconductor film with a gate insulating film interposed therebetween.

26. A semiconductor device according to claim 23 wherein said insulating layer is 10–200 Å thick.

27. A semiconductor device including at least one n-channel thin film transistor, said n-channel thin film transistor comprising:

an underlying layer comprising silicon oxide;

a semiconductor film comprising crystal silicon formed over said underlying layer, said semiconductor film having been crystallized by virtue of a catalyst metal;

source and drain regions formed within said semiconductor layer and having a n-type conductivity;

a channel region formed within said semiconductor layer between said source and drain regions;

an insulating layer formed at a boundary between said underlying layer and an entire bottom surface of said semiconductor film, said insulating layer comprising an oxide of silicon and said catalyst metal; and a gate electrode formed over said semiconductor film with a gate insulating film interposed therebetween, wherein said channel region contains boron in a concentration from $1\times10^{15}$ to $1\times10^{18}$ atoms/cm$^3$.

28. A semiconductor device according to claim 27 wherein a thickness of said semiconductor film is 100–500 Å.

29. A semiconductor device according to claim 27 wherein said semiconductor film contains said catalyst metal at a concentration not exceeding $1\times10^{19}$ atoms/cm$^3$.

30. A semiconductor device according to claim 29 wherein said semiconductor film contains said catalyst metal at a concentration higher than $1\times10^{15}$ atoms/cm$^3$.

31. A semiconductor device including at least one n-channel thin film transistor, said n-channel thin film transistor comprising:

a semiconductor film comprising crystal silicon formed over a substrate, said semiconductor film containing a catalyst metal for promoting crystallization thereof at a concentration not higher than $1\times10^{19}$ atoms/cm$^3$ and having a thickness 100–500 Å;

source and drain regions formed within said semiconductor layer and having a n-type conductivity;

a channel region formed within said semiconductor layer between said source and drain regions; and a gate electrode adjacent to said semiconductor film with a gate insulating film interposed therebetween, wherein said channel region contains boron in a concentration from $1\times10^{15}$ to $1\times10^{18}$ atoms/cm$^3$.

32. A semiconductor device according to claim 31 wherein said semiconductor film contains said catalyst metal at a concentration higher than $1\times10^{15}$ atoms/cm$^3$.

33. A semiconductor device according to claim 31 wherein said semiconductor film contains a recombination center neutralizer selected from the group consisting of hydrogen or a halogen at 0.005 to 5 atom %.

34. A semiconductor device including at least one n-channel thin film transistor, said n-channel thin film transistor comprising:

a semiconductor film comprising crystal silicon formed over a substrate, said semiconductor film containing a catalyst metal for promoting crystallization thereof at a concentration not higher than $1\times10^{19}$ atoms/cm$^3$ and having a thickness 100–500 Å;

source and drain regions formed within said semiconductor layer and having an n-type conductivity;

a channel region formed within said semiconductor layer between said source and drain regions; and a gate electrode adjacent to said semiconductor film with a gate insulating film interposed therebetween, wherein said channel region contains boron.

35. A semiconductor device according to claim 34 wherein a concentration of said boron in said channel region is not higher than $1\times10^{18}$ atoms/cm$^3$.

36. A semiconductor device according to claim 34 wherein a concentration of said boron in said channel region is not lower than $1\times10^{15}$ atoms/cm$^3$.

* * * * *